United States Patent
Jost et al.

(10) Patent No.: US 9,507,005 B2
(45) Date of Patent: Nov. 29, 2016

(54) DEVICE AND CURRENT SENSOR FOR PROVIDING INFORMATION INDICATING A SAFE OPERATION OF THE DEVICE OF THE CURRENT SENSOR

(71) Applicant: Infineon Technologies AG, Neubiberg (DE)

(72) Inventors: Franz Jost, Stuttgart (DE); Carlos Castro Serrato, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 14/197,702

(22) Filed: Mar. 5, 2014

(65) Prior Publication Data

US 2015/0253412 A1    Sep. 10, 2015

(51) Int. Cl.
*G01R 33/09* (2006.01)
*G01R 35/00* (2006.01)

(52) U.S. Cl.
CPC .............. *G01R 35/005* (2013.01); *G01R 33/09* (2013.01); *G01R 35/00* (2013.01)

(58) Field of Classification Search
CPC ..... G01R 33/09; G01R 35/005; G01R 35/00
USPC ......................................... 324/116–126, 252
See application file for complete search history.

(56) References Cited

U.S. PATENT DOCUMENTS

| | | | | |
|---|---|---|---|---|
| 5,351,005 A * | 9/1994 | Rouse | ..................... | G01R 17/10 324/207.21 |
| 5,696,445 A * | 12/1997 | Inbar | ..................... | G01R 33/1253 324/210 |
| 6,433,545 B1 * | 8/2002 | Kunze | ..................... | G01R 33/09 324/207.21 |
| 7,323,870 B2 * | 1/2008 | Tatschl | ..................... | G01L 25/00 257/E27.005 |
| 7,723,982 B2 * | 5/2010 | Sasaki | ..................... | G11B 5/455 324/210 |
| 2006/0262457 A1 * | 11/2006 | Hirata | ..................... | B82Y 10/00 360/319 |
| 2010/0211347 A1 * | 8/2010 | Friedrich | ........... | G01R 33/0023 702/117 |
| 2011/0169488 A1 * | 7/2011 | Mather | ................ | G01R 33/098 324/252 |
| 2013/0049748 A1 * | 2/2013 | Sebastiano | ......... | G01R 33/0017 324/252 |
| 2014/0035076 A1 * | 2/2014 | Zhang | ..................... | H01L 43/08 257/421 |

OTHER PUBLICATIONS

Olson et al. *Design of Integrated Magnetoresistive Current Sensors for IPEMs*, University of Wisconsin-Madison, pp. 6-1 through 6-6, as available at http://www.epes.vt.edu/_media/annual_reports/2002/Report/VolumeIIPartII/6CSI/1.pdf on Mar. 5, 2014.

* cited by examiner

*Primary Examiner* — Jay Patidar
(74) *Attorney, Agent, or Firm* — Schiff Hardin LLP

(57) ABSTRACT

An example of a device comprises a signal generator to generate a signal causing a magnetic self test field for a magneto-resistive sensing element. A signal input is configures to receive a first sensor signal at a first time instant before the magnetic self test field is applied and a second sensor signal at a second time instant after the magnetic self test field is applied. An evaluation circuit is configured to determine information indicating a safe operation based on an evaluation of the first sensor signal and the second sensor signal.

14 Claims, 5 Drawing Sheets

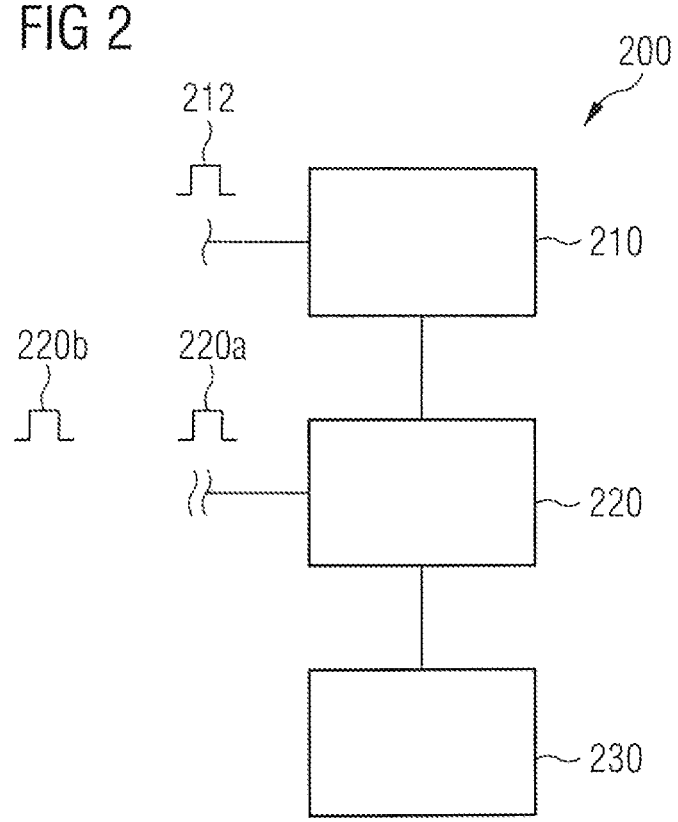

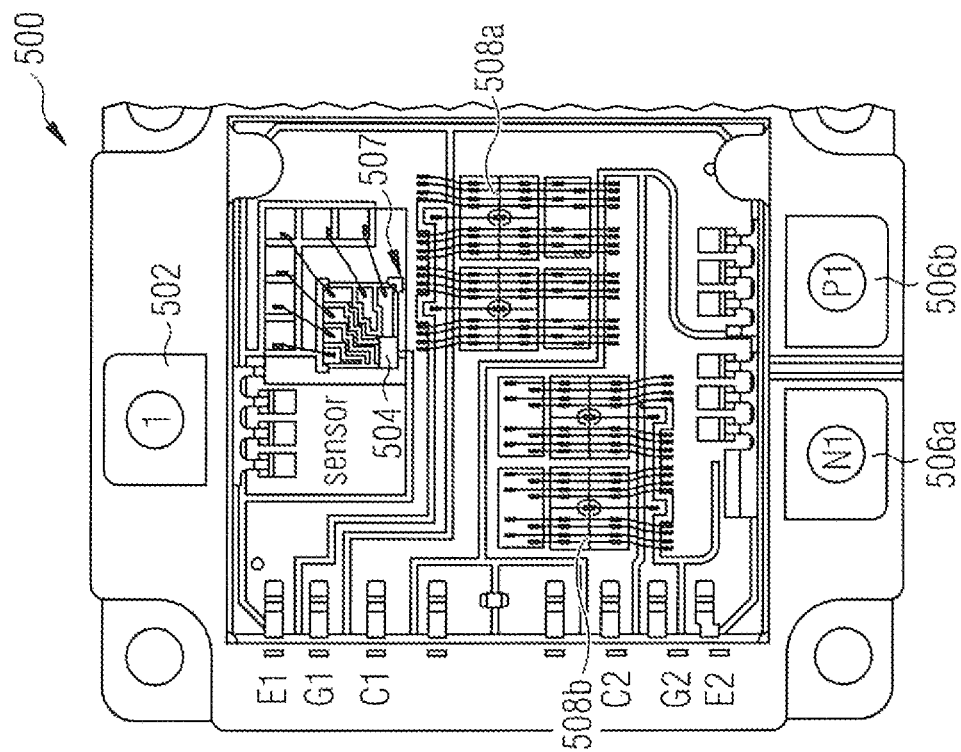
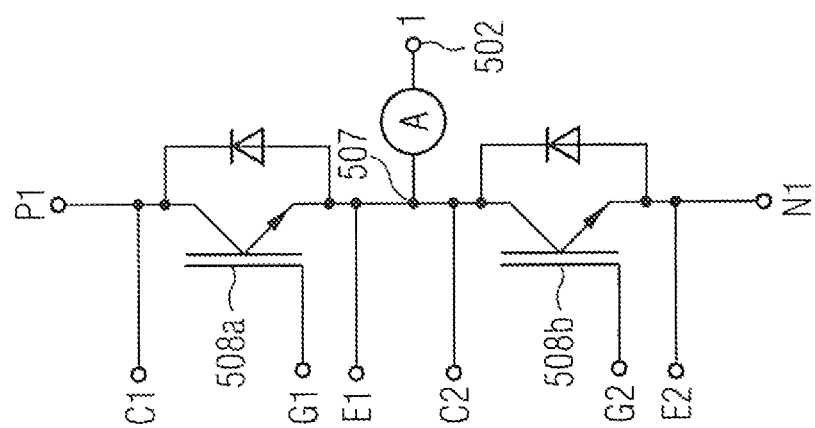
FIG 5

DEVICE AND CURRENT SENSOR FOR PROVIDING INFORMATION INDICATING A SAFE OPERATION OF THE DEVICE OF THE CURRENT SENSOR

TECHNICAL FIELD

Example embodiments relate to devices comprising magneto-resistive sensing elements for sensing of magnetic fields and concepts to determine information indicating a safe operation of the device.

BACKGROUND

Devices comprising magneto-resistive sensing elements are used in numerous applications. For example, some current sensing devices use magneto-resistive sensing elements in order to determine the magnetic field generated by a current through a conductor so as to be able to conclude on the size of the current based on the size of the magnetic field determined using the magneto-resistive sensing element.

Current sensors may, for example, be used to determine the current flowing through or within a power module or power converter used to provide an alternating supply voltage. Power converters of that kind are, for example, used to provide the supply voltages for electric motors. Electric motors may be used for driving a vehicle or particular component of the vehicle, for example a steering or the like.

In numerous applications, there is a desire to be able to determine information indicating a safe operation of the magneto-resistive sensing element or the device containing it so as to be able to conclude whether the result determined using the magneto-resistive sensing element is reliable. Further, the information indicating a safe operation should be determined avoiding high additional costs or high consummation of space by additional devices.

SUMMARY

According to some example embodiments this may be achieved by a device comprising a signal generator to generate a signal causing a magnetic self-test field for a magneto-resistive sensing element and a signal input to receive a first sensor signal at a first time instant before the magnetic self-test field is applied and a second sensor signal at a second time instant after the magnetic self-test field is applied. An evaluation circuit of the device determines information indicating a safe operation based on an evaluation of the first sensor signal and the second sensor signal. Using a self-test field, information indicating a safe operation may be determined avoiding, for example, redundant magneto-resistive sensing elements for the same purpose and their associated additional costs.

According to some example embodiments, it is determined that the device is in a safe operation state if a difference between the first sensor signal and the second sensor signal corresponds to an expected sensor response to the magnetic self-test field. The difference of the first sensor signals and the second sensor signal may be compared to the expected response of the magneto-resistive sensing element to the magnetic self-test field.

Example embodiments of a current sensor comprise at least one magneto-resistive sensing element to provide a sensor signal in response to a magnetic field. A signal generator is configured to cause a magnetic self-test field at the magneto-resistive sensing element of the current sensor. A readout circuit of the current sensor receives a first sensor signal at a first time instant before the magnetic self-test field is applied and a second sensor signal at a second time instant after the magnetic self-test field is applied. An evaluation circuit determines information indicating a safe operation of the current sensor based on an evaluation of the first sensor signal and the second sensor signal which may serve to conclude whether the information on the current as determined by the current sensor is reliable.

Example embodiments of a power converter comprise at least one converter module to provide an alternating output voltage, the converter module being coupled to an output terminal by means of a conductor path. A current sensor is placed within the magnetic field generated by a current through the conductor path. From the magnetic field generated by a single conductor path within the power converter, the current provided by the power converter may be determined within the power converter itself so as to be able to, for example, control electric motors receiving their supply voltage from the power converter. This may be achieved without additional external circuitry or components and with high accuracy so as to avoid additional costs, also in terms of additionally required space for further components next to the power converters.

BRIEF DESCRIPTION OF THE FIGURES

Some embodiments of apparatuses and/or methods will be described in the following by way of example only, and with reference to the accompanying figures, in which FIG. 1a schematically illustrates an example embodiment of a current sensor;

FIG. 2 schematically illustrates an example embodiment of a device;

FIG. 5 illustrates an example of a power converter for providing an alternating output voltage.

DETAILED DESCRIPTION

Figure 1A:
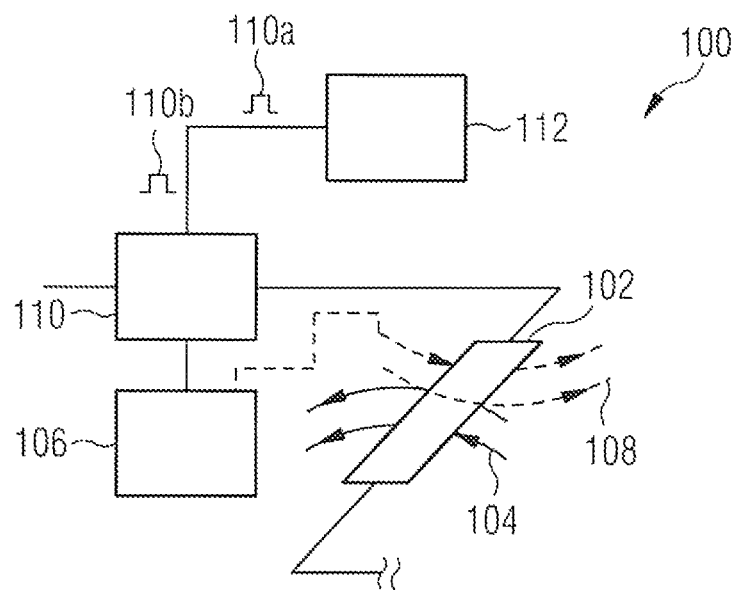
FIG. 1b schematically illustrates an example embodiment of a current sensor.

Various example embodiments will now be described more fully with reference to the accompanying drawings in which some example embodiments are illustrated. In the figures, the thicknesses of lines, layers and/or regions may be exaggerated for clarity.

Accordingly, while further embodiments are capable of various modifications and alternative forms, some example embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 illustrates an example embodiment of a current sensor 100, comprising at least one magneto-resistive sensing element 102. The magneto-resistive sensing element 102 is used to generate or provide a sensor signal in response to a magnetic field. The magneto-resistive sensing element 102 may, for example, be composed of or comprise material subject to the anisotropic magneto-resistive-effect (AMR), giant magneto-resistive effect (GMR), or colossal magneto-resistive-effect (CMR). As illustrated in FIG. 1, it is assumed that an external electromagnetic field 104 is to be measured by the magneto-resistive sensing element 102. The strength of the external electromagnetic field 104 causes a variance of the resistivity of the magneto-resistive sensing element 102. The variance of the resistivity may be determined by means of a variance of a current flowing through the magneto-resistive sensing element 102 if a constant operating voltage is provided or by a change of a voltage over the magneto-resistive sensing element 102 if constant current is provided through the magneto-resistive sensing element 102. A signal generator 106 of the current sensor 100 causes a magnetic self-test field 108 at the magneto-resistive sensing element 102.

Figure 1B:
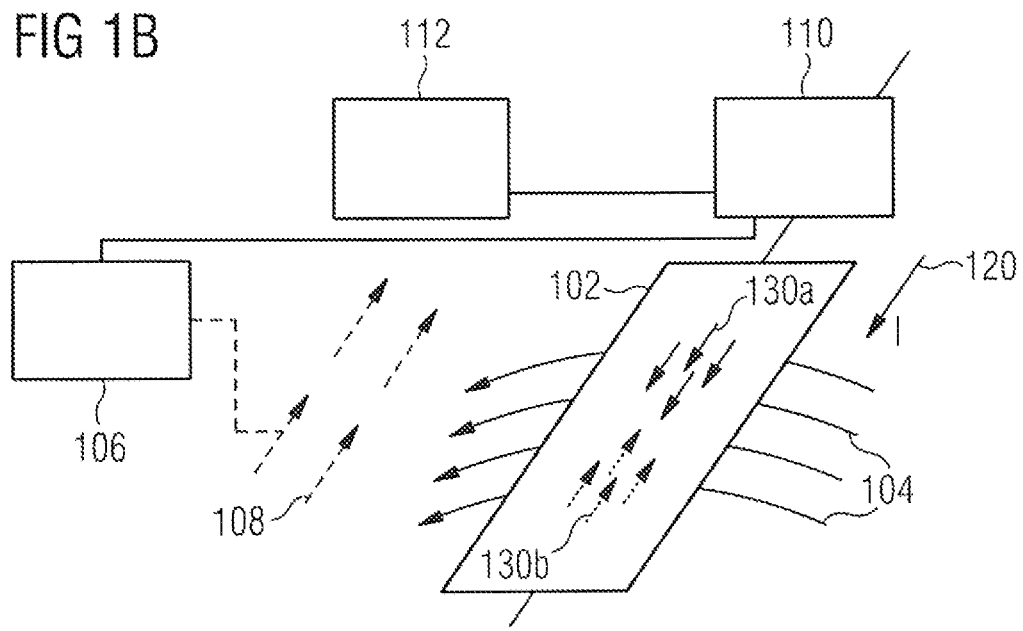

FIG. 1a illustrates one particular of numerous possible configurations in which the self-test field 108 is directed opposite to the external magnetic field 104. According to further examples, however, the relative orientation of the magnetic self-test field 108 and the external magnetic field 104 may be different. FIG. 1b illustrates further examples in which the magnetic self test field 108 may be oriented in parallel or anti-parallel to a current direction 120 which is the direction in which a current passes through the sensing element 102. The magnetic self-test field 108 may also be applied without the presence of an external magnetic field 104. A readout circuit 110 receives a first sensor signal 110a at a first time instant before the magnetic self-test field 108 is applied and a second sensor signal 110b at a second time instant after the second sensor signal is applied. According to some examples, one sensor signal of the first sensor signal 110a and the second sensor signal 110b is determined while the magnetic self-test field 108 is applied or superimposed, as illustrated in FIG. 1a. According to further examples, the application of the magnetic self test field 108 ends before the second time instant so that both the first sensor signal 110a and the second sensor signal 110b are determined without the simultaneous presence of the magnetic self test field 108, as illustrated in FIG. 1b. An evaluation circuit 112 determines information indicating a safe operation of the current sensor 100 based on an evaluation of the first sensor signal 110a and the second sensor signal 110b. That is, information regarding the reliability or safe operation of the current sensor 100 is determined by the evaluation circuit 112 in that a sensor signal is determined or received before and after the application of the magnetic self-test field 108.

Using an embodiment may, for example, avoid the necessity to use shunt resistors and other current sensing devices. Determining current using shunt resistors relies on the measurement of a voltage drop across a small shunt resistor in order to calculate the output current. However, due to the shunt resistor, additional losses are generated and therefore the overall effectiveness of the system is reduced. Furthermore, the losses increase the temperature of the device and, due to thermal coupling, the temperature of adjacent components which makes their integration in, for example, a power module a challenge. Embodiments may, for example, further avoid the use of other conventional current sensors essentially being open loop transducers using hall-effect devices, which have a high cost. Furthermore, the size of those current sensors and their components makes their integration into devices to be monitored almost impossible.

While some particular embodiments may read out or receive the second sensor signal 110b when no external field or the external magnetic field 104 is present, further embodiments may also apply a further magnetic self-test field at the second time instant provided that the further magnetic self-test field is different from the magnetic self-test field at the first time instant.

According to some particular embodiments, the evaluation circuit 112 determines that the current sensor is in a safe operation state if a difference between the first sensor signal 110a and the second sensor signal 110b corresponds to an expected response of the magneto-resistive sensing element 102 to the magnetic self-test field 108. A magnetic self-test field 108 of known characteristic or strength may be superimposed on the magneto-resistive sensing element 102 and the change of the sensor signal as provided from the magneto-resistive sensing element 102 is compared to an expected change of a fully operational magneto-resistive sensing element having applied thereto an identical magnetic self-test field 108. Once the expected sensor response is determined by an evaluation of the first sensor signal 110a and the second sensor signal 110b, it can be concluded that the current sensor 100 is in a safe operation mode, that the readout and/or the results obtained using the current sensor are reliable.

If the expected sensor response is not determined, a warning signal may be generated. The warning signal indicates that the sensor signals determined using the magnetoresistive sensing element are not reliable. This information may be forwarded to subsequent circuitry relying on the sensor signals by the warning signal. Depending on the particular implementation, the warning signal may, for example, indicate one of numerous levels of reliability or integrity, for example according to the IEC EN 61508 Standard (Functional safety of electrical/electronic/programmable electronic safety related systems). Further embodiments may use other standards based on IEC 61508 which defines four Safety Integrity Levels (SILs), with SIL 4 being the most dependable and SIL 1 being the least.

Automotive Safety Integrity Level (ASIL) is an example for functional safety definitions for applications in the automotive industry. For example, an electric motor may be driven by a power converter which may necessitate the monitoring of the current to the motor using a magneto-resistive sensing element. The current may serve as an input to a closed loop control for operating the motor. If the measurements from the magneto-resistive sensing element or the power converter comprising the magneto-resistive sensing element become unreliable, control loop circuitry or other circuitry may be informed by a warning signal compliant with ASIL. This may allow combining components of different manufacturers. In turn, the circuitry may decide that a different mode of operation may be required in order to maintain safe operation of the motor. Just as an example, it may be decided to switch from closed loop control to open loop control disregarding the information on the measured current in the engine.

The magnetic self-test field 108 at the magneto-resistive sensing element 102 may be generated using arbitrary technology. Some sensor readout schemes, for example, employ a compensation coil to compensate the external magnetic field 104 at the magneto-resistive sensing element 102 if a current flows through the compensation coil. A corresponding readout circuitry relies on balancing the current in the current compensation coil such that a superposition of a magnetic field as generated by the compensation coil to the external magnetic field 104 leads to an effective field of zero seen by the magneto-resistive sensing element 102. This particular readout may compensate for long-term drifts of the sensitivity of the magneto-resistive sensing elements and hence allow for a current sensor being stable and reliable over prolonged periods of use. According to some examples, the compensation coil is further used to provide or generate the magnetic self-test field 108 at the magneto-resistive sensing element 102. To this end, the signal generator 106 generates or causes a current through the compensation coil. This may allow to reuse already existing circuitry in order to provide for the possibility to self-testing and to indicate whether the current sensor 100 is in a safe or reliable mode of operation or not.

Some examples use anisotropic magneto-resistive sensing elements (AMR-sensors). The AMR-sensing elements of some examples are operated with so-called AMR-flipping. A flipping coil is present within the current sensor or within the sensor assembly which allows flipping of a direction of a magnetization of the anisotropic magneto-resistive sensing element. In particular, the flipping coil is configured to generate a magnetic field parallel or antiparallel to the current through the magneto-resistive sensing element which serves to inverse the sensitivity or response of the magneto-resistive sensing element. This may enable determination of offset values of the response of the magneto-resistive sensing element by using the mean-value of a first sensor signal with a first magnetization direction and of a second sensor signal with an opposite direction of magnetization, even at the presence of external magnetic fields. By comparing two sensor signals with opposite magnetization taken at the presence of an external magnetic field in subsequent time intervals, an intrinsic offset may be determined and compensated.

According to some embodiments, the flipping coil is used to provide the magnetic self-test field, i.e., the control signal generator generates or causes a current through the flipping coil to enable the determination of the information indicating a safe operation of the current sensor. According to some examples, the current used to generate the magnetic self-test field in the flipping coil is smaller than a flipping current used to flip the magnetization of the anisotropic magneto-resistive (AMR) sensing element.

According to further embodiments, no current is applied to the flipping coils at the second time instant since a flipping current is applied between the first time instant and the second time instant to flip a direction of the magnetization of an AMR sensing element, as schematically illustrated in FIG. 1b. The magnetic field generated by the flipping current in the flipping coils causes a change of the direction of a magnetization of the AMR sensing element 102 by roughly 180 degrees and serves as the magnetic self test field 108. The direction of magnetization is either in parallel (130a) or anti-parallel (130b) to the direction 120 of a current through the AMR sensing element 102. Depending on the direction of the magnetization, a sensor response or resistivity changes by a predetermined amount. FIG. 1b illustrates the resistivity depending on the strength of an external magnetic field component 104 which is perpendicular to the direction 120 of the current for both directions 130a and 130b of magnetization of the AMR sensing element 102. At a given external magnetic field 104, the resistivity of the AMR sensing element 102 jumps when the magnetization is flipped. The jump is centered around an offset value given by the mean value of the resistivity at the first time instant and the resistivity at the second time instant. If the offset value deviates substantially from an expected offset value or mean value, it may be concluded that the magnetoresistive sensing element 102 is in an operationally unsafe condition. The expected offset value may, for example, be determined using a previous pair of measurement signals. According to those examples, the first sensor signal is determined before the direction of magnetization of the AMR sensing element 102 is flipped and the second sensor signal is determined after the flipping. The change of the signal of the AMR sensing element is compared to an expected response or change and if the expectation is not met, unreliable operation is suspected. For example, a first pair of a first sensor signal and a second sensor signal may be used to determine an expected offset value at a first measurement time and a second pair of a first sensor signal and a second sensor signal may be used to determine a further offset value at a second measurement time. If the offset value deviates significantly from the expected offset value, it may be concluded that the AMR sensing element 102 is in an unsafe or unreliable operation state.

In some embodiments, the offset value determined by measurements with different magnetizations may additionally be used to determine long term variations of the sensing elements characteristics due to, for example, temperature changes or the like. That is, a variation of the offset value as determined by two measurements with opposing magnetization may be used to increase the accuracy of the sensor readout and to compensate for long term effects while a strong variation of two subsequently determined offset values may indicate an insecure or unsafe operation state of the sensing element. According to some examples, the time interval between the first measurement time and the second measurement time used to check the functional safety of the AMR sensing element may be chosen shorter than a time interval in which long term variations of the AMR sensing element occur.

FIG. 2 illustrates an example of a device 200 comprising a signal generator 210 to generate a signal causing a magnetic self-test field for a magneto-resistive sensing element. The device 200 further comprises a signal input 220 to receive a first sensor signal 220a at a first time instant before a self-test field is applied and a second sensor signal 220b at a second time instant after the self test field is applied. An evaluation circuit 230 determines information indicating a safe operation based on an evaluation of the first sensor signal 220a and the second sensor signal 220b. A device 200 as illustrated schematically in FIG. 2 may be used to determine information indicating a safe operation of an existing current sensor when the current sensor is operated or controlled by the device 200. The control signal 212 is, according to some examples, configured to cause a current through the compensation coil of the magneto-resistive sensing element. According to further examples, the control signal 212 is configured to cause a current through a flipping coil of an anisotropic magneto-resistive sensing element to either cause a flipping of the magnetization of the sensing element or a superposition of an additional magnetic field by means of the flipping coils.

According to a particular embodiment, the evaluation circuit 230 is configured to determine that the magneto-resistive sensing element is in a safe operation state if a difference between the first sensor signal 220a and the second sensor signal 220b corresponds to an expected response of the magneto-resistive sensing element to the magnetic self-test field.

Figure 3:
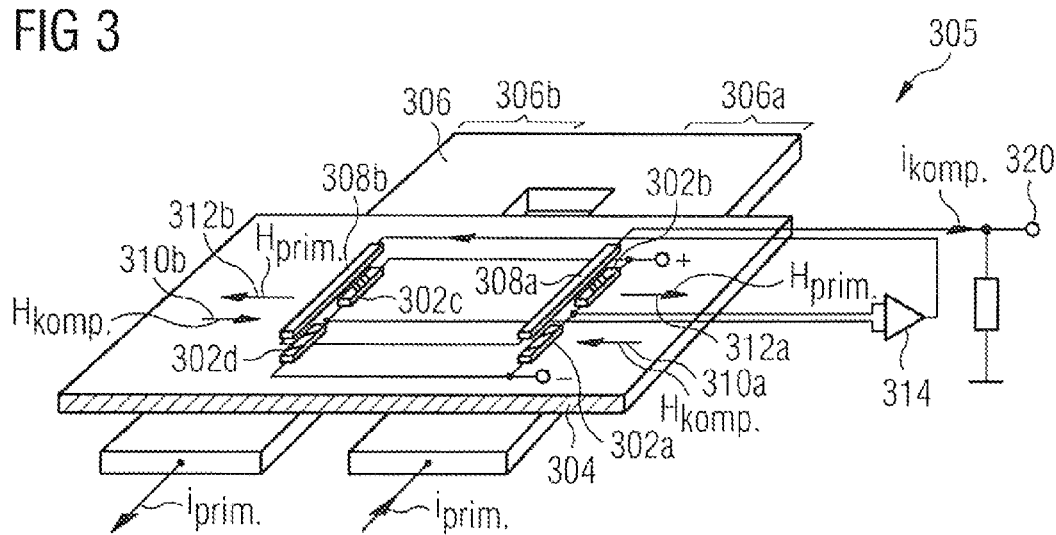
FIG. 3 illustrates an example embodiment of a current sensor.

FIG. 3 illustrates one particular example of a current sensor, having four AMR-sensing elements 302a to 302d coupled together as a Wheatstone bridge. The Wheatstone bridge of the magneto-resistive sensing elements 302a to 302d are formed on top of an insulating substrate 304, as for example a direct bonded copper substrate (DBC).

The substrate 304 is placed on top of a U-shaped conductor-path 306 having the current to be measured by means of the current sensor 305 of FIG. 3. The AMR-sensors or magneto-resistive sensing elements 302a to 302d used in the embodiment of FIG. 3 are illustrated in detail in FIG. 4 and are placed on top of the U-shaped conductor path 306 so that the magneto-resistive sensing elements 302a and 302b are on top of a first segment 306a of the conductor path 306 and the magneto-resistive sensing elements 302c and 302d are on top of a second segment 306b of the conductor path 306. The current through the individual segments 306a and 306b flows in the opposite direction. Due to the geometrical position of the magneto-resistive sensing elements, each pair of magneto-resistive sensing elements 302a/302b and 302c/302d mainly experiences the magnetic field provided by one of the conductor segments 306a and 306b. The sensor signal as provided by the current sensor 306 is generated using two compensation coils or compensation conductors 308a and 308b placed on top of the magneto-resistive sensing elements 302a/302b and 302c/302d so that a current generated through the compensation coils generates a compensating magnetic field having its field vector 310a, 310b opposing to the field vector of a primary magnetic field 312a, 312b generated by the conductor path 306. A readout amplifier 314 is used to generate a current through the compensation coils 308a and 308b so that an effective magnetic field being the superposition of the primary magnetic field 312a/312b and the compensation magnetic field 310a/310b superimposes to a field of zero at the position of the magneto-resistive sensing elements 302a to 302d.

The current through the compensation coils 302a and 302b is a measure for the magnetic field and, hence, a sensor signal being indicative of the current through the conductor path 306 is determined as a voltage at an output terminal 320 of the current sensor 305. By using a readout with compensation coils as illustrated in FIG. 3, a sensitivity drift may be compensated for so that long-term stability can achieved.

According to some examples, the compensation coils 308a and 308b are also used to generate an additional magnetic self-test field for the magneto-resistive sensing elements so that their functionality may be tested. For example, it may be indicated that the readout of the current sensor 305 is reliable or that the magneto-resistive sensing elements are functionally safe if a magnetic self-test field additionally superimposed by means of the compensation coils 308a and 308b causes a response of the sensor signal as it can be expected due to the additional magnetic self-test field. In the example illustrated in FIG. 3 this may be achieved by changing the control so that the primary magnetic field 310 and the secondary magnetic field 312 do not compensate completely but only to some predetermined amount. The resultant current through the compensation coil can then be determined as a sensor signal and evaluated if it corresponds to the expected response or not to conclude on the functional safety of the current sensor.

Figure 4:
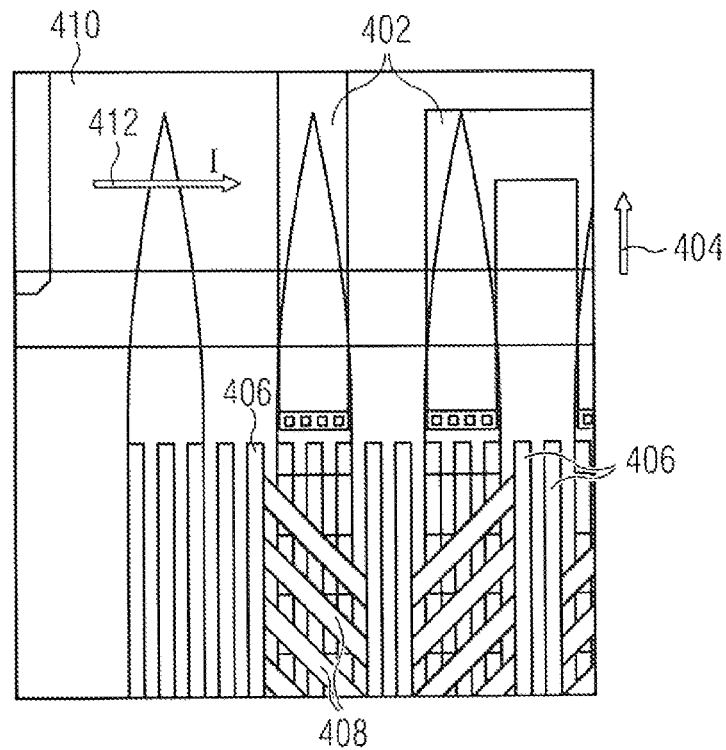
FIG. 4 illustrates an example of a magneto-resistive element to be used within an example of a device or a current sensor.

FIG. 4 illustrates in detail as to how an individual magneto-resistive sensing element may be composed. The following components of the magneto-resistive sensing element are formed on a common substrate. The conductor path of the AMR-material 402 is running in serpentines and in parallel to a direction 404 which is parallel or antiparallel to the current which is to be sensed. Compensation coils 405 run in parallel to the direction 404 and on top of the AMR-material strips 402 on an opposite side to the conductor path 406. The AMR-strips 402 furthermore comprise barber-pole shorting bars 408 which are, for example, be composed of copper below the AMR-material or of gold above the AMR-material and which serve to generate a bi-polar response of the AMR-strips 402. The flipping coil 410 extends in a direction 412 perpendicular to the direction 404 so that a current through the flipping coil 410 can be used to flip a magnetization of the AMR-material strips 402 to become parallel to the direction 404 or anti-parallel thereto. While one particular implementation of a magneto-resisting sensitive element is illustrated in FIG. 4, further exemplary embodiments may also use different configurations or magneto-resistive sensing elements composed of different materials.

According to some of the embodiments discussed, a magnetic self-test field can be superimposed or applied to the magneto-resistive sensing elements or AMR-strips 402 by either one of the compensation coil 406 or the flipping coil 410 or by both of them simultaneously so as to allow to conclude whether the current sensor is operationally safe or reliable or not.

FIG. 5 illustrates a particular example of a converter module 500 of power module or power converter having at least one converter module 500 to provide an alternating output voltage and an output terminal 502 of the converter module 500. An example of a current sensor according to an embodiment is placed within the magnetic field generated by a current through a conductor path coupling the converter module to the output terminal 502. The converter module comprises a first input for a negative supply voltage 506a and a second input 506b for a positive supply voltage. A first insulated gate bi-polar transistor 508a serves to couple the positive supply voltage 506b to the output terminal via the conductor path 507 and a second insulated gate bi-polar transistor 508b serves to couple the negative supply voltage 506a to the output terminal 502 via the conductor path 507. Placing a single current sensor within the magnetic field generated by the current through the conductor path 507 allows measurement of the current through the power converter within the power converter itself so allowing for compact and flexible devices. That is, the current drawn by, for example, electric motors driven by a power converter 600 as illustrated in FIG. 6 can be directly measured within the power converter itself so that the quantity used within the closed-loop control of the electric motor can be determined with high accuracy and without the need of additional components next to the power converter, as it is required according to some conventional approaches.

Figure 6:
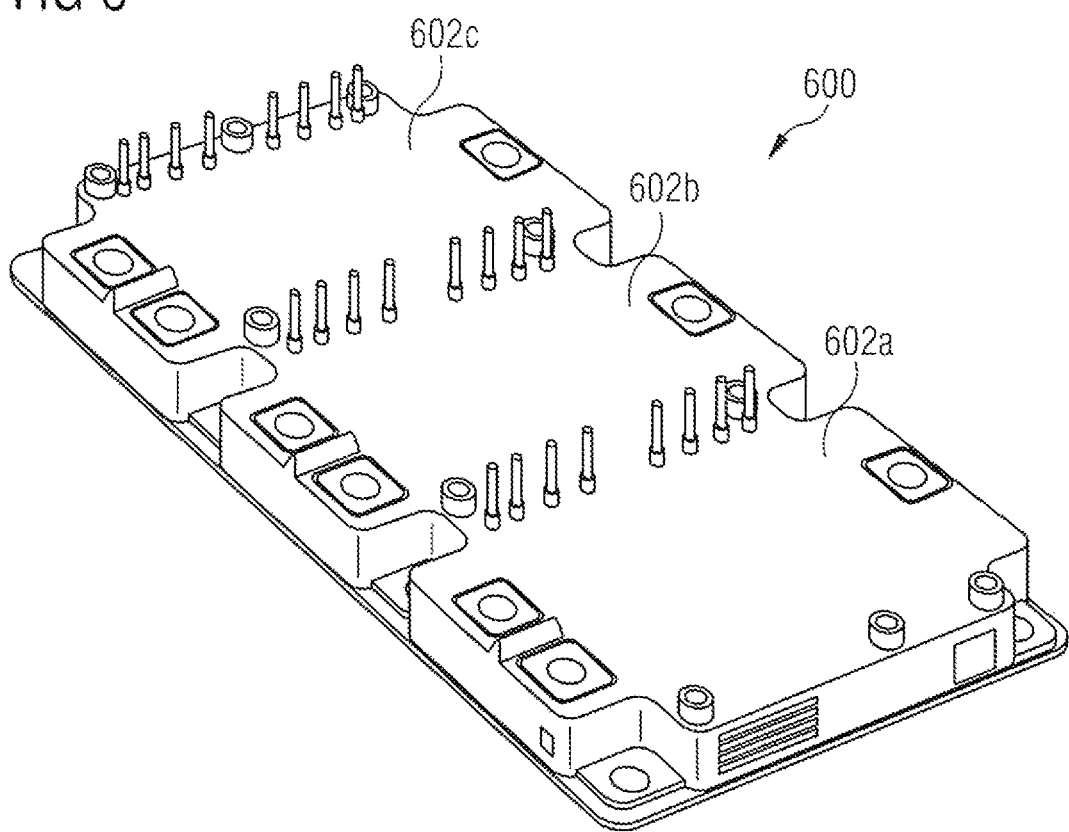
FIG. 6 illustrates an example of a power converter for providing three phases of alternating current.

FIG. 6 illustrates a further example of a power converter 600 consisting of three converter modules 602a to 602c as illustrated in FIG. 5 so that an AC-voltage having three alternating phases can be provided. This may serve to drive an electric motor with the required supply voltages.

According to some exemplary embodiments, a current sensor as, for example, illustrated in FIG. 3 is placed on top of the conductor path 507 within a converter module 500 of a power converter 600. According to further embodiments, the conductor path 507 may exhibit a recess in which the current sensor is applied in a direction perpendicular to the surface of the conductor path 507. This may serve to additionally save space within the power converter 600, at the same time allowing to accurately measure the current within the power converter 600 since the sensitive area of the current sensor is parallel to a magnetic field component. In this particular example, the magnetic field component is generated by the edge of the recess within the conductor path.

In other words, FIG. 6 illustrates an inverter system usable for converting high-voltage DC power into multiphase AC power required to drive an electric. Most of the applications use a 3-phase inverter consisting of three halfbridge legs, each of them connected to one of the three load terminals. A nearly constant DC-bus voltage (battery) supplies a full bridge consisting of six switches. By controlling the switches, voltage pulse patterns are generated at the output terminals, which cause a sinusoidal current with an inductive load. The inverter is thus used to provide variable frequency output voltages and currents of different values. In order to provide the proper voltage and current patterns to the load (motor), the load current of the power module has to be measured very precisely.

In summary, by integrating current sensors based on the magnetoresistance effect (MR) in the power module the cost and size of the whole system can be significantly reduced while not affecting the performance of the inverter. The xMR (AMR-AnisotropicMagnetoResistance, GiantMagnetoResistance, TunnelMagnetoResistance) sensors allow a potential free measurement of the current via magnetic field. This sensor measures the field in plane (field component which is parallel to the plane of the current bar). The magnetic field of the primary current in the power module will change the resistance of the MR sensor bridge. This resistor change generates an electrical output which may be processed electronically by an ASIC or μC. The MR sensors are made on substrates like—silicon, ceramics, polymers electrically isolated from the substrate and isolated from the primary current. Any bridge configuration (half, full) as stand-alone sensor, monolithically integrated with a evaluation chip or stacked chips may be used. A simple linear output bridge may be used, also a gradiometric arrangement to suppress stray fields or a matrix approach with TMR cells can be used. A magnetoresistive sensor may be used, placed isolated in the vicinity (on the top) of a shaped current bar in the DCB to measure the current in the bar. The shape of the current bar may be designed to measure the magnetic field generated by the current just at one coordinate, at two coordinates or more in the vicinity of the bar. The MR sensors may measure DC and AC currents from Milliampere to 1000 Ampere from DC to 5 MHz. The sensor is not in electrical contact with the current bar (galvanic isolated) and with a modification on the sensor topology it can be made functionally safe due to a self test principle (AMR flipping). FIG. 3 shows the closed loop compensation approach which gives a high accuracy. FIG. 4 shows an AMR sensor with flipping and compensation coils integrated on a chip. The sensor of FIG. 4 has no magnetic core, avoiding saturation or hysteresis effects and allowing very small devices which may enable its integration without using large areas in the power module and so saving cost and increasing power density. Due to the contactless magnetic measurement principle there is an inherent galvanic isolation between the high voltage IGBT parts and the sensor output signal The integration of current sensors into power modules may be desirable for every power class starting from low power applications as for auxiliary drives or DC-DC converters up to high power applications as for inverters or generators for full hybrids and electric vehicles. The internal layout of each half bridge may be adapted to make the integration possible. A current rail (CR) may be designed into the layout of the direct bonded copper (DBC) substrates for each half bridge. At the top of the current rail a second small DBC may be fixed as carrier for the dual current sensors. The second ceramic helps simultaneously to adapt the distance between current rail and sensor. The current rail (in which a current flows and the MR sensor detects the magnetic field in the vicinity) may be designed as a rectangular shape, with a slot inside or in a U-form.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the abovedescribed methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A device, comprising:
   a signal generator to generate a signal causing a magnetic self test field for a magneto-resistive sensing element;
   a signal input to receive a first sensor signal of the magneto-resistive sensing element at a first time instant before the magnetic self test field is applied and a second sensor signal of the magneto-resistive sensing element at a second time instant after the magnetic self test field is applied; and
   an evaluation circuit to determine information indicating a safe operation based on an evaluation of the first sensor signal and the second sensor signal,
   wherein the evaluation is configured to determine that the magneto-resistive sensing element is in a safe operation state if a difference between the first sensor signal and the second sensor signal corresponds to an expected response of the magneto-resistive sensing element to the magnetic self test field.

2. The device of claim 1, wherein the signal is configured to cause a current through a compensation coil of the magneto-resistive sensing element.

3. The device of claim 1, wherein the signal is configured to cause a current through a flipping coil of an anisotropic magneto-resistive sensing element.

4. The device of claim 3, wherein the signal is configured to cause a current through the flipping coil which is smaller than a further current used to flip a direction of a magnetization of the anisotropic magneto-resistive sensing element.

5. The device of claim 3, wherein the signal is configured to cause a flipping current through the flipping coil which generates a magnetic flipping field causing a flipping of a direction of a magnetization of the anisotropic magneto-resistive sensing element.

6. The device of claim 1, wherein the signal generator is further configured to cause a further magnetic self test field after the second time instant.

7. A current sensor comprising:
   at least one magneto-resistive sensing element to provide a sensor signal in response to a magnetic field;
   a signal generator to cause a magnetic self test field at the magneto-resistive sensing element;
   a readout circuit to receive a first sensor signal of the magneto-resistive sensing element at a first time instant before the magnetic self test field is applied and a second sensor signal of the magneto-resistive sensing element at a second time instant after the magnetic self test field is applied; and
   an evaluation circuit to determine information indicating a safe operation of the current sensor based on an evaluation of the first sensor signal and the second sensor signal;
   wherein the evaluation circuit is configured to determine that the magneto-resistive sensing element is in a safe operation state if a difference between the first sensor signal and the second sensor signal corresponds to an expected response of the magneto-resistive sensing element to the magnetic self test field.

8. The current sensor of claim 7, further comprising:
   at least one compensation coil to compensate an external magnetic field at the magneto-resistive sensing element at least partly if a current flows through the compensation coil, wherein the signal generator is configured to cause a current through the compensation coil.

9. The current sensor of claim 7, comprising four magneto-resistive sensing elements, the magneto-resistive sensing elements being coupled as a Wheatstone bridge.

10. The current sensor of claim 7, wherein the magneto-resistive sensing element is an anisotropic magneto-resistive sensing element.

11. The current sensor of claim 10, further comprising:
    at least one flipping coil to flip a direction of a magnetization of the anisotropic magneto-resistive sensing element.

12. The current sensor of claim 11, wherein the signal generator is configured to cause a flipping current through the flipping coil, the flipping current generating a magnetic flipping field used to flip the magnetization of the anisotropic magneto-resistive sensing element.

13. The current sensor of claim 12 wherein the signal generator generates a current through the flipping coil which is smaller than the flipping current.

14. The current sensor of claim 12, wherein the evaluation circuit is configured to determine that the magneto-resistive sensing element is in a safe operation state if a difference between the first sensor signal and the second sensor signal corresponds to an expected offset of the magneto-resistive sensing element.

* * * * *